(12) United States Patent
Okahisa

(10) Patent No.: US 9,559,489 B2
(45) Date of Patent: Jan. 31, 2017

(54) SEMICONDUCTOR LASER DEVICE, LIGHT SOURCE DEVICE, METHOD OF PRODUCING SEMICONDUCTOR LASER DEVICE, AND METHOD OF PRODUCING LIGHT SOURCE DEVICE

(71) Applicant: NICHIA CORPORATION, Anan-shi, Tokushima (JP)

(72) Inventor: Eiichiro Okahisa, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 14/979,346

(22) Filed: Dec. 22, 2015

(65) Prior Publication Data

US 2016/0190767 A1 Jun. 30, 2016

(30) Foreign Application Priority Data

Dec. 26, 2014 (JP) ................... 2014-264049

(51) Int. Cl.
| | |
|---|---|
| *H01S 5/00* | (2006.01) |
| *H01S 5/022* | (2006.01) |
| *H01S 5/024* | (2006.01) |
| *H01S 5/02* | (2006.01) |
| *H01S 5/0625* | (2006.01) |
| *H01S 5/40* | (2006.01) |

(52) U.S. Cl.
CPC ........... *H01S 5/02236* (2013.01); *H01S 5/022* (2013.01); *H01S 5/02244* (2013.01); *H01S 5/02256* (2013.01); *H01S 5/02272* (2013.01); *H01S 5/02276* (2013.01); *H01S 5/02476* (2013.01); *H01S 5/02* (2013.01); *H01S 5/02212* (2013.01); *H01S 5/0625* (2013.01); *H01S 5/4025* (2013.01)

(58) Field of Classification Search
CPC ............. H01S 5/02256; H01S 5/02236; H01S 5/02272; H01S 5/02; H01S 5/022; H01S 5/4025; H01S 5/02476; H01S 5/02244
USPC ........................................................ 372/43.01
See application file for complete search history.

(56) References Cited

U.S. PATENT DOCUMENTS

| | | | | |
|---|---|---|---|---|
| 8,391,326 | B1* | 3/2013 | Tamaya | H01S 5/02469 372/34 |
| 9,059,569 | B2* | 6/2015 | Yamanaka | H01S 5/02212 |
| 2006/0081866 | A1 | 4/2006 | Takahashi et al. | |
| 2011/0280266 | A1* | 11/2011 | Hayashi | H01S 5/02216 372/43.01 |

(Continued)

FOREIGN PATENT DOCUMENTS

| | | |
|---|---|---|
| JP | H04-226095 A | 8/1992 |
| JP | 06-84555 | 3/1994 |

(Continued)

*Primary Examiner* — Kinam Park
(74) *Attorney, Agent, or Firm* — Foley & Lardner LLP

(57) ABSTRACT

A semiconductor laser device includes a semiconductor laser element; a mounting body on which the semiconductor laser element is mounted; a base having a recess in which the mounting body is mounted and a through hole that penetrates a part of a bottom of the recess; and an embedded member disposed within the through hole. An uppermost surface of the embedded member is joined to a lowermost surface of the mounting body and a lowermost surface of the embedded member is positioned higher than a lowermost surface of the base.

20 Claims, 10 Drawing Sheets

(56) References Cited

U.S. PATENT DOCUMENTS

| | | | |
|---|---|---|---|
| 2013/0195134 A1* | 8/2013 | Okahisa | H01S 5/024 372/43.01 |
| 2014/0198509 A1* | 7/2014 | Takiguchi | H01S 5/02 362/382 |

FOREIGN PATENT DOCUMENTS

| | | |
|---|---|---|
| JP | H06-302912 A | 10/1994 |
| JP | 2004-235212 | 8/2004 |
| JP | 2005-333087 | 12/2005 |
| JP | 2008-010492 | 1/2008 |
| JP | 2008-294259 A | 12/2008 |
| JP | 2013-153092 | 8/2013 |
| WO | WO-2009/116133 A1 | 9/2009 |

* cited by examiner

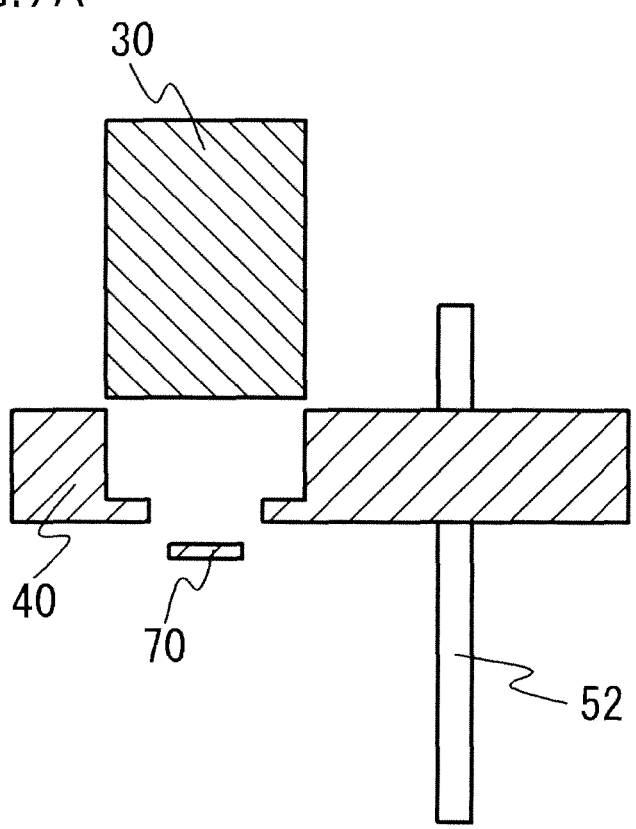

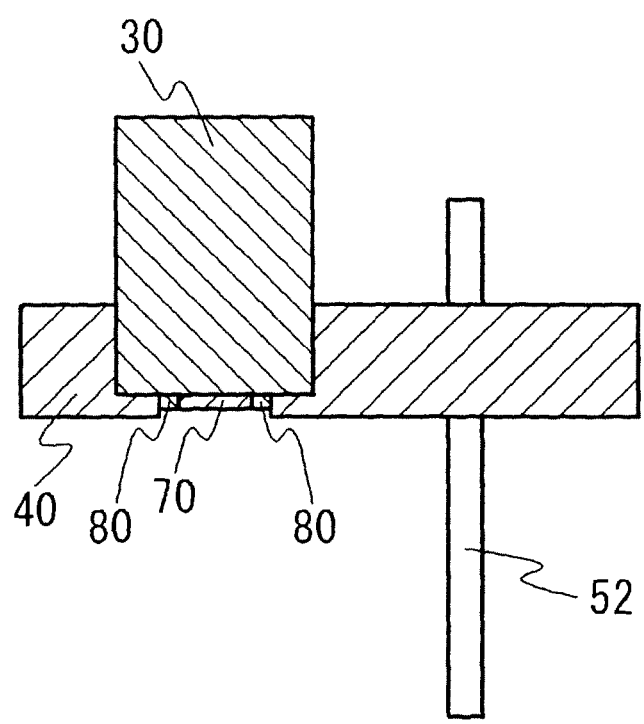

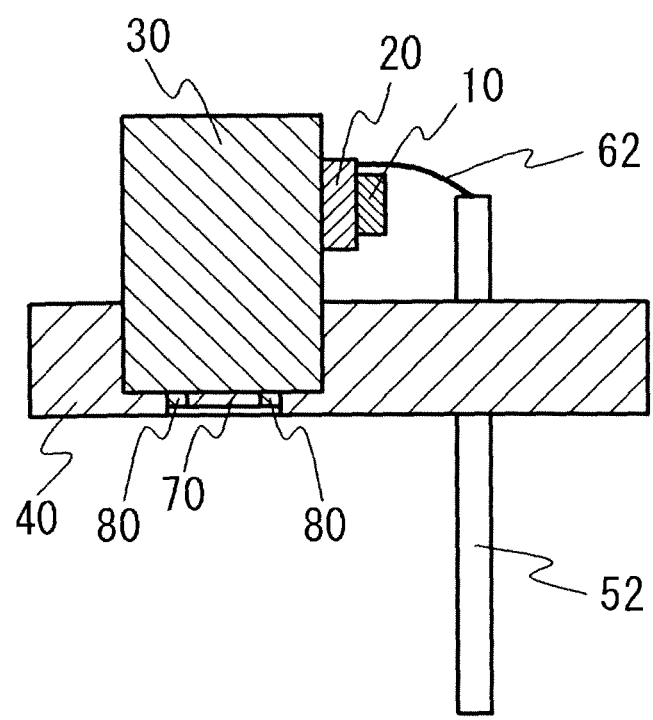

SEMICONDUCTOR LASER DEVICE, LIGHT SOURCE DEVICE, METHOD OF PRODUCING SEMICONDUCTOR LASER DEVICE, AND METHOD OF PRODUCING LIGHT SOURCE DEVICE

CROSS-REFERENCE TO RELATED APPLICATION

This application claims priority to Japanese Patent Application No. 2014-264049, filed on Dec. 26, 2014, the entire disclosure of which is incorporated herein by reference.

BACKGROUND

1. Technical Field

This disclosure relates to a semiconductor laser device, light source device, method of producing a semiconductor laser device and method of producing a light source device.

2. Description of Related Art

A semiconductor laser device comprising a semiconductor laser element, a mounting body on which the semiconductor laser element is mounted, and a base connected to the mounting body has been proposed in the Patent Reference 1 (Japanese Unexamined Patent Application Publication No. 2013-153092). The base has a recess to which the mounting body is fitted. The recess has a through hole in a portion of the bottom. According to this conventional semiconductor laser device, a stepped part is formed in the recess and thereby the mounting body is stably held with the base. And thus, variation in heat dissipation is suppressed and it is prevented as much as possible that the base or the mounting body is misaligned in position and orientation.

While the conventional semiconductor laser device is good at suppressing a variation in heat dissipation, there is still a room to improve a mounting accuracy in mounting the semiconductor laser device on the mounting substrate.

SUMMARY

A semiconductor laser device includes a semiconductor laser element; a mounting body on which the semiconductor laser element is mounted; a base having a recess in which the mounting body is mounted and a through hole that penetrates a part of a bottom of the recess; and an embedded member disposed within the through hole. An uppermost surface of the embedded member is joined to a lowermost surface of the mounting body and a lowermost surface of the embedded member is positioned higher than a lowermost surface of the base.

A light source device includes: a mounting substrate, the above-described semiconductor laser device and a connecting member connecting the lowermost surface of the base to the mounting substrate.

A method of producing a semiconductor laser device includes providing a mounting body; providing a base including a recess and a through hole that penetrates a part of a bottom of the recess; providing an embedded member; mounting the mounting body in the recess of the base, while joining a lowermost surface of the mounting body to an uppermost surface of the embedded member so that a lowermost surface of the embedded member is positioned higher than a lowermost surface of the base; and mounting a semiconductor laser element on the mounting body.

A method of producing a light source device includes producing a semiconductor laser device according to the above-described method for producing a semiconductor laser device, and mounting the semiconductor laser device on a mounting substrate using a connecting member so that the lowermost surface of the base is used as a mounting surface.

According to the above-described devices and methods, a semiconductor laser device, a method of producing the semiconductor laser device, a light source device and a method of producing the light source device in which not only a variation in heat dissipation is reduced but also mounting accuracy to the mounting substrate is increased can be provided.

BRIEF DESCRIPTION OF THE DRAWINGS

FIG. 7A is a schematic view explaining a method of producing the semiconductor laser device according to Embodiment 1.

FIG. 7B is a schematic view explaining the method of producing the semiconductor laser device according to Embodiment 1.

FIG. 7C is a schematic view explaining the method of producing the semiconductor laser device according to Embodiment 1.

DETAILED DESCRIPTION OF THE EMBODIMENTS

Semiconductor Laser Device According to Embodiment 1

Figure 1:
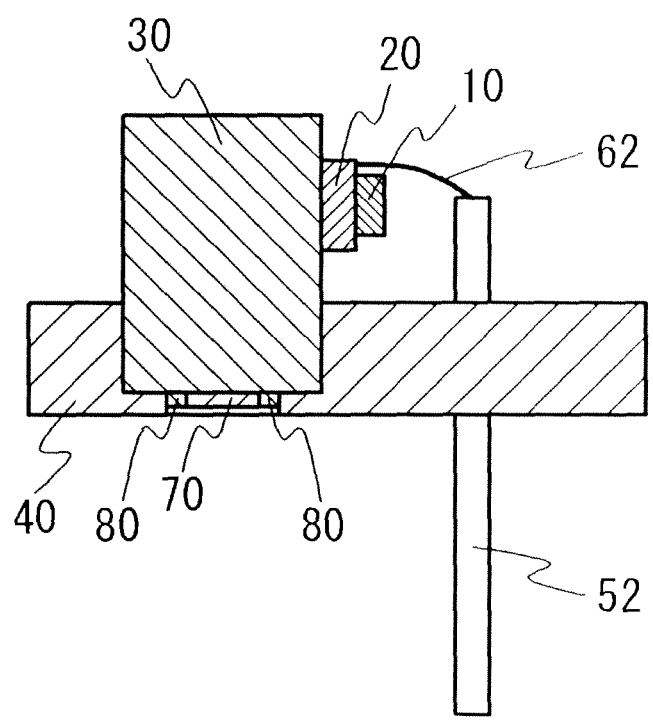
FIG. 1 is a schematic cross-sectional view of a semiconductor laser device according to Embodiment 1.
Figure 2:
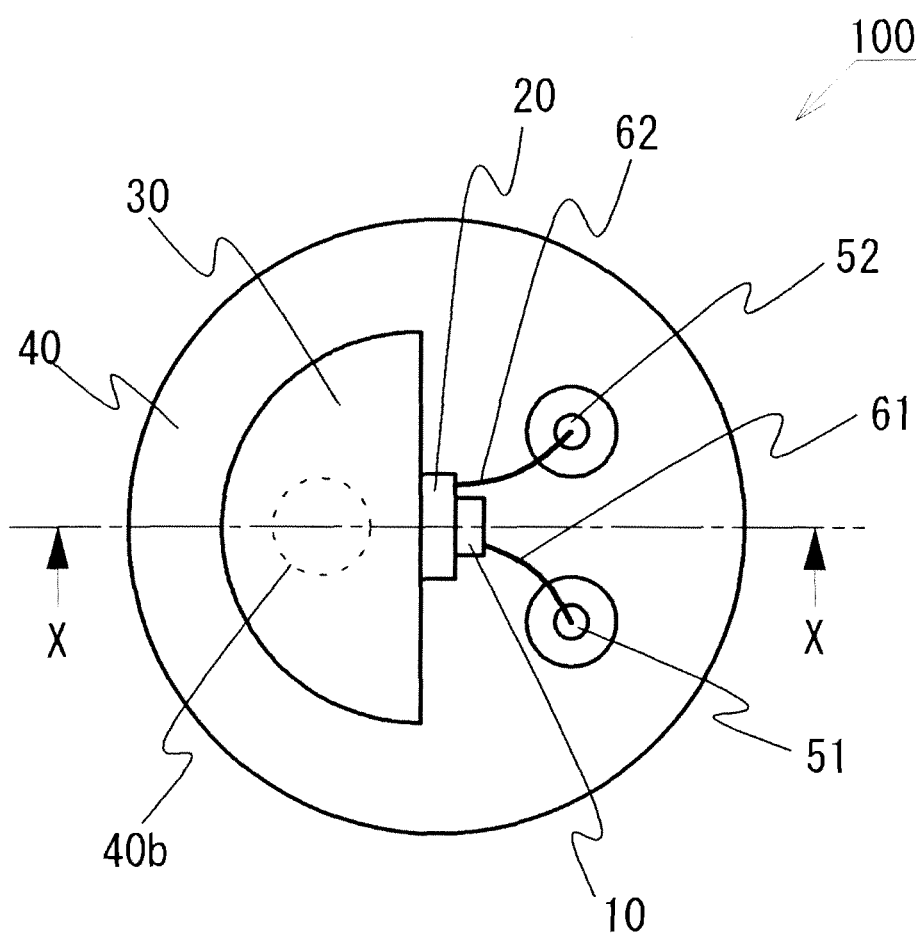
FIG. 2 is a schematic plan view of the semiconductor laser device according to Embodiment 1.
Figure 3:
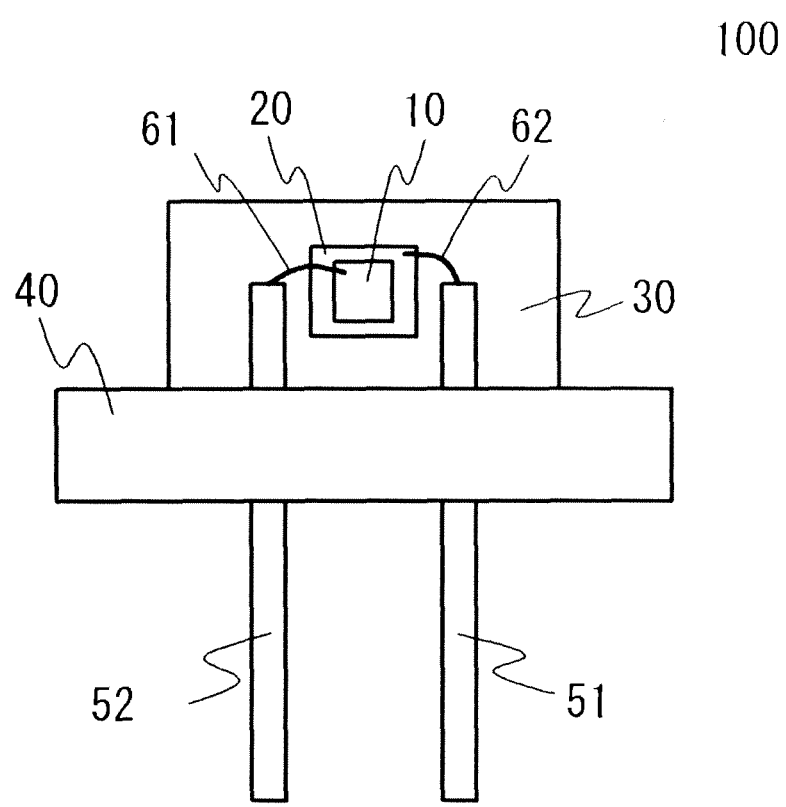
FIG. 3 is a schematic side view of the semiconductor laser device according to Embodiment 1.
Figure 4:
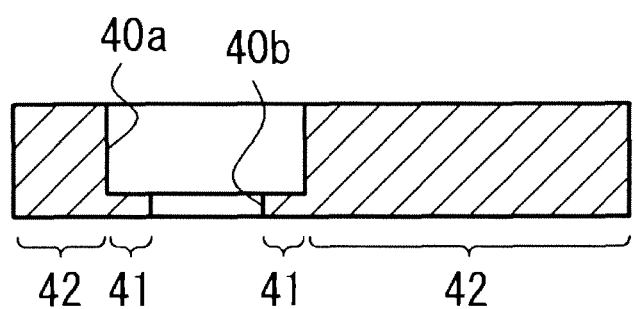
FIG. 4 is a cross-sectional view of a base according to Embodiment 1.

FIGS. 1, 2 and 3 are, respectively, a schematic cross-sectional view, a schematic plan view and a schematic side view of a semiconductor laser device according to Embodiment 1. FIG. 4 is a schematic cross-sectional view of a base according to Embodiment 1. As shown in FIGS. 1 to 4, a semiconductor laser device 100 according to Embodiment 1 includes a semiconductor laser element 10, a mounting body 30 on which the semiconductor laser element 10 is mounted, a base 40 and an embedded member 70. The base has a recess 40a and a through hole 40b. The mounting body 30 is mounted in the recess 40a. The through hole 40b penetrates a part of a bottom of the recess 40a. The embedded member 70 is disposed within the through hole 40b. An uppermost surface of the embedded member 70 is joined to the lowermost surface of the mounting body 30. A lowermost surface of the embedded member 70 is positioned higher than a lowermost surface of the base 40. Detail explanations will follow.

(Semiconductor Laser Element 10)

For the semiconductor laser element 10, for example, a semiconductor laser element in which a nitride semiconductor is employed. The semiconductor laser element 10 has a p-electrode and n-electrode. The p-electrode is formed for example on one side of the semiconductor laser element 10. The n-electrode is formed for example on another side of the semiconductor laser element 10. A multimode (multi transverse mode) semiconductor laser element can also be used as the semiconductor laser element 10. While the semiconductor laser element tends to degrade due to a variation in heat dissipation in high output power operation, a multimode (multi transverse mode) semiconductor laser element is an element that is usually used in high output power operations. This embodiment can reduce the variation in heat dissipation, and, therefore, the effect of this embodiment is prominently obtained in the case where a multimode (multi transverse mode) semiconductor laser element is used as the semiconductor laser element 10.

(Mounting Body 30)

The semiconductor laser element 10 is mounted on the mounting body 30 (in this embodiment, on one side surface of the mounting body 30). More specifically, a part of the mounting body 30 is projected upwardly from the base 40, and the semiconductor laser element 10 is fixed in a predetermined region of the projected portion of the mounting body 30. The other part of the mounting body 30 is fitted into the recess 40*a* that is formed in the base 40. The mounting body 30 functions as a heat sink. The mounting body 30 is preferably made of a metal material with superior heat dissipation such as copper so that the heat generated at the semiconductor laser element 10 can efficiently dissipate to the mounting body 30.

An interposing body 20 (so-called submount) can be interposed between the semiconductor laser element 10 and the mounting body 30. Employing the interposing body 20 whose thermal conductivity is higher than that of the mounting body 30, it is allowed to dissipate heat generated at the semiconductor laser element 10 to the mounting body 30 more efficiently. In a case where the interposing body 20 is constituted of, for example, an insulator such as an aluminum nitride, silicon carbide, silicon, diamond or the like, the semiconductor laser element 10 is insulated from the mounting body 30. A conductive layer that electrically connects the semiconductor laser element 10 to the outside can be formed at an upper surface of the interposing body 20.

(Base 40)

The base 40 is also known as a stem or an eyelet. The base 40 is made of a metal material that has a lower thermal conductivity than that of the mounting body 30. Iron, iron alloy or the like are examples of such a metal material. The base 40 made of such a metal material allows to join a cap 90, which is a member for hermetic sealing, to the base 40 by welding or the like. If the thermal conductivity of the base 40 was too high, the heat would diffuse, and thus it would be difficult to join the cap 90 to the base 40 by welding or the like.

The base 40 has a recess 40*a* and a through hole 40*b*. The mounting body 30 is disposed in the recess 40*a*. The through hole 40*b* penetrates a part of the bottom of the recess 40*a*. Here, a remaining part 41 is a part excluding the through hole 40*b* from the bottom of the recess 40*a*. The thickness of the remaining part 41 in a vertical direction is a half or less of the maximum thickness of the base 40 in the vertical direction. The region of the base 40 excluding the remaining part 41 (hereinafter referred to as the "main part 42") has a greater thickness in the vertical direction than the thickness of the remaining part 41 in the vertical direction, and the remaining part 41 has a smaller thickness in the vertical direction than the thickness of the main part 42 in the vertical direction. The region laterally extending from the main part 42 is the remaining part 41, which defines a portion of the recess 40*a* and the through hole 40*b*. A lowermost surface of the main part 42 is preferably as on the same plane as a lowermost surface of the remaining part 41. This allows to increase the area to be in contact with a mounting substrate 300, and thereby to increase heat dissipation.

The thickness of the remaining part 41 can be made in a range of 5% to 30%, preferably in a range of 5% to 25%, more preferably in a range of 10% to 20% of the maximum thickness of the base 40. It is not preferable in terms of heat dissipation that the thickness of the remaining part 41 is too thin because the thermal expansion coefficient difference between the materials constituting the base 40 and the mounting body 30 might cause the remaining part 41 to be warped upwardly or downwardly. An upwardly or downwardly warped remaining part 41 reduces the contact area between the base 40 and the mounting substrate 300. On the contrary, in a case where the thickness of the remaining part 41 is too thick, the mounting body 30 with higher heat dissipation is more distant from the lowermost surface of the base 40, and heat dissipation is readily reduced as a whole.

In a plan view, the area of the through hole 40*b* can be in a range of 5% or more and 80% or less, preferably in a rage of 10% or more and 70% or less, more preferably in a range of 15% or more and 50% or less of the area of the bottom of the recess 40*a*. Given that the cap 90 needs to be welded onto the base 40, the base 40 tends to have a lower thermal conductivity than the embedded member 70. The larger the area that the through hole 40*b* occupies in the bottom of the recess 40*a*, the larger the area of the embedded member 70. Accordingly, the heat dissipation becomes higher. On the other hand, the smaller the area that the through hole 40*b* occupies in the bottom of the recess 40*a*, the larger the area of the remaining part. Therefore, it becomes easier to mount the mounting body 30 to the remaining part 41 and hermetic sealing can be readily ensured. Accordingly, the semiconductor laser device can be readily mounted on the mounting substrate 300.

The recess 40*a* and the through hole 40*b* can be formed, for example, by forming a hole that vertically penetrates the base 40, and by making an indentation in the base 40 by pressing a protruded die from an upper side in a region that includes an area in which the hole is formed and that is larger than the area in which the hole is formed. This allows that a portion corresponding to the protrusion of the die becomes the recess 40*a* and a part of the hole that vertically penetrates the base 40 (that is, the remaining part that are not pressed) becomes the through hole 40*b*. By pressing the base 40 so as not to completely close the hole that vertically penetrates the base 40, the remaining part 41 can be formed thinner and more stably utilizing the ductility of the material constituting the base 40. There may be a case in which a material constituting the base 40 enters into the through hole 40*b* by a press, and the size of the through hole 40*b* becomes inconsistent. In this case, in order to make the size of the through hole 40*b* consistent, removing a region that remains after a press and is slightly larger than the through hole 40*b* by a punch or the like according to a size of the desired through hole 40*b*, a through hole 40*b* can be obtained. The excess material occurred by a press, that is, a material remaining lower than the lower surface of the base 40, may also be removed at the same time.

(Embedded Member 70)

The embedded member 70 is disposed within the through hole 40*b*. The uppermost surface of the embedded member 70 is joined to the lowermost surface of the mounting body 30. The lowermost surface of the embedded member 70 is positioned higher than the lowermost surface of the base 40. This makes it possible to reduce a variation of heat dissipation and to mount the semiconductor laser device 100 on the mounting substrate 300 at a predetermined position and orientation. This is described in greater detail below.

Figure 6:
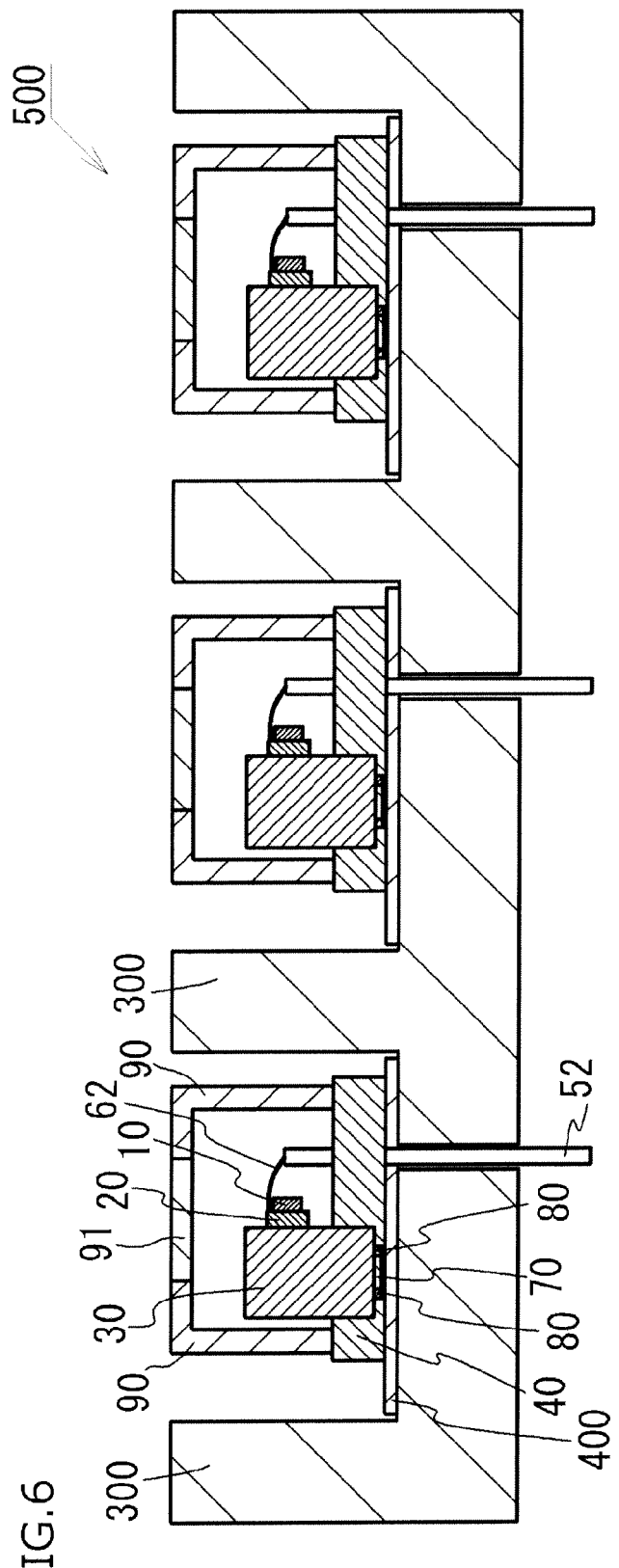
FIG. 6 is a schematic cross-sectional view of a light source device according to Embodiment 1.

As illustrated in FIG. 6 described later, the semiconductor laser device 100 is mounted on a mounting substrate 300 using a connecting member 400. The flux and solvent that the connecting member 400 includes are vaporized by heat at the mounting process and this vaporization generate a void (an air) in the through hole 40b. The position or orientation of the semiconductor laser device 100 in relation to the mounting substrate 300 may be misaligned from the predetermined position or orientation due to expansion of the void or the air staying in the through hole 40b. Accordingly, in this embodiment, the embedded member 70 is disposed within the through hole 40b. With this arrangement, a space in the through hole 40b is reduced, and then the void or the air staying in the space is also reduced. Thereby, it is prevented as much as possible that position or orientation of the semiconductor laser device is misaligned during the mounting process due to expansion of the void or the air.

While a lowermost surface of the embedded member 70 is preferably on the same plane as a lowermost surface of the base 40 from a view of heat dissipation, it is difficult in general to align those surfaces on the same plane because the thermal expansion coefficients of the base 40 and the embedded member 70 are different one another and there may be a variation in the size of the base 40 or the size of the embedded member 70. Accordingly, the embedded member 70 is disposed so that the lowermost surface of the embedded member 70 is positioned higher than the lowermost surface of the base 40. With this arrangement, the semiconductor laser device 100 in which a variation in heat dissipation is reduced can be provided.

The shortest distance between the lowermost surface of the embedded member 70 and the lowermost surface of the base 40 can preferably be in range of 1 µm to 50 µm, more preferably in a range of 1.5 µm to 30 µm, further preferably in a range of 2 µm to 20 µm. Within the above-described ranges, the larger the shortest distance, the better suppressed the mounting variation caused by the thermal expansion coefficient difference between the base 40 and the embedded member 70. On the other hand, the smaller the shortest distance, the better suppressed that gas such as air or a void caused from the connecting member 400 stays in the through hole 40b.

The embedded member 70 is not particularly limited, but preferably has a periphery extending along a periphery of the through hole 40b. In other words, the embedded member 70 preferably has the same shape as that of the through hole 40b and it is preferable that the through hole 40b is filled by the embedded member 70 substantially without any gap between an outer lateral surface of the embedded member 70 and an inner lateral surface of the through hole 40b. This makes it substantially impossible for air to stay in the through hole 40b (or this allows that air is present only in an amount that substantially avoids misalignment in the position or orientation of the semiconductor laser device 100), so that the semiconductor laser device 100 can be mounted on the mounting substrate 300 at the predetermined position and orientation.

There may be a slight gap between the embedded member 70 and the through hole 40b. In other words, the embedded member 70 can have a slightly smaller shape than that of the through hole 40b. By using a configuration in which the size of the embedded member 70 is smaller than that of the through hole 40b, it becomes possible to accommodate an accidental error of the sizes at the manufacturing process. The embedded member 70 can be formed, for example, in a size so that the distance between an inner lateral surface of the through hole 40b and an outer lateral surface the embedded member 70 is in a range of 20 µm or lager and 100 µm or less. Within this range, the smaller the size of the embedded member 70, the easier it is to form the embedded member 70 within the through hole 40b. On the other hand, the larger the embedded member 70, the smaller the gap between the through hole 40b and the embedded member 70, so that gas such as air or a void caused from the connecting member 400 is more effectively prevented from staying in the through hole 40b.

In a case where the through hole 40b has a cylindrical shape for example, it is preferable that the embedded member 70 has a cylindrical shape whose bottom surface is a circular and the diameter of the circular is smaller than the through hole 40b. With this arrangement, the embedded member 70 is readily manufactured. It is preferable to fill the gap between the outer lateral surface of the embedded member 70 and the inner lateral surface of the through hole 40b with a joining member 80. This makes it totally impossible for gas such as air or void caused from the connecting member 400 to stay in the through hole 40b, and the semiconductor laser device 100 can be mounted on the mounting substrate 300 even more at the predetermined position and orientation.

The embedded member 70 is preferably made of a high thermal conductivity material so as to efficiently dissipate the heat that is diffused to the mounting body 30 via the embedded member 70. For easier joining of the mounting body 30 to the embedded member 70, the embedded member 70 is preferably constituted of a metal material at its uppermost surface, and is preferably constituted of a metal material (e.g., copper plate material, or the like) in its entirety. From another view, the embedded member 70 is preferably made of the same material as the mounting body 30. With this arrangement, the mounting body 30 has as the same thermal expansion coefficient as the embedded member 70, and the embedded member 70 can be stably and securely joined with the mounting body 30.

(Joining Member 80)

The joining member 80 may be disposed between the outer lateral surface of the embedded member 70 and the inner lateral surface of the through hole 40b. With this arrangement, it is prevented as much as possible that gas such as air stays in the through hole 40b, and the semiconductor laser device 100 can be more reliably mounted on the mounting substrate 300 at the predetermined position and orientation. It is preferable to dispose the joining member 80 entirely around the embedded member 70 so as to fill the gap between the outer lateral surface of the embedded member 70 and the inner lateral surface of the through hole 40b. With this arrangement, it is even more reliably prevented that gas such air stays in the through hole 40b, and the semiconductor laser device 100 can be more reliably mounted on the mounting substrate 300 at the predetermined position and orientation. For example, silver solder can be used as the joining material 80.

(Lead Terminal)

The semiconductor laser device 100 includes a first lead terminal 51 and a second lead terminal 52 for supplying current to the semiconductor laser element 10. In this embodiment, the first lead terminal 51 and the second lead terminal 52, each extending up and down, are disposed in a region of the base 40 other than the recess 40a. Each lead terminal is fixed to the base 40 via an insulator. The first lead terminal 51 is electrically connected to an upper surface side of the semiconductor laser element 10 using a first wire 61. The second lead terminal 52 is electrically connected to a lower surface side of the semiconductor laser element 10 using a second wire 62.

According to the semiconductor laser device of Embodiment 1 explained above, the embedded member 70 disposed within the through hole 40b prevents air from staying in the through hole 40b as much as possible. Therefore, not only a variation in heat dissipation is reduced, but also misaligning in position or orientation at the mounting process due to expansion of air in the through hole 40b is prevented as much as possible. Accordingly, the semiconductor laser device 100 in which a variation in heat dissipation is reduced can be mounted on the mounting substrate 300 at the predetermined position and orientation. Thus, according to the semiconductor laser device of Embodiment 1, it becomes possible not only to reduce a variation in heat dissipation, but also to increase the mounting accuracy on the mounting substrate.

Semiconductor Laser Device 200 According to Embodiment 2

Figure 5:
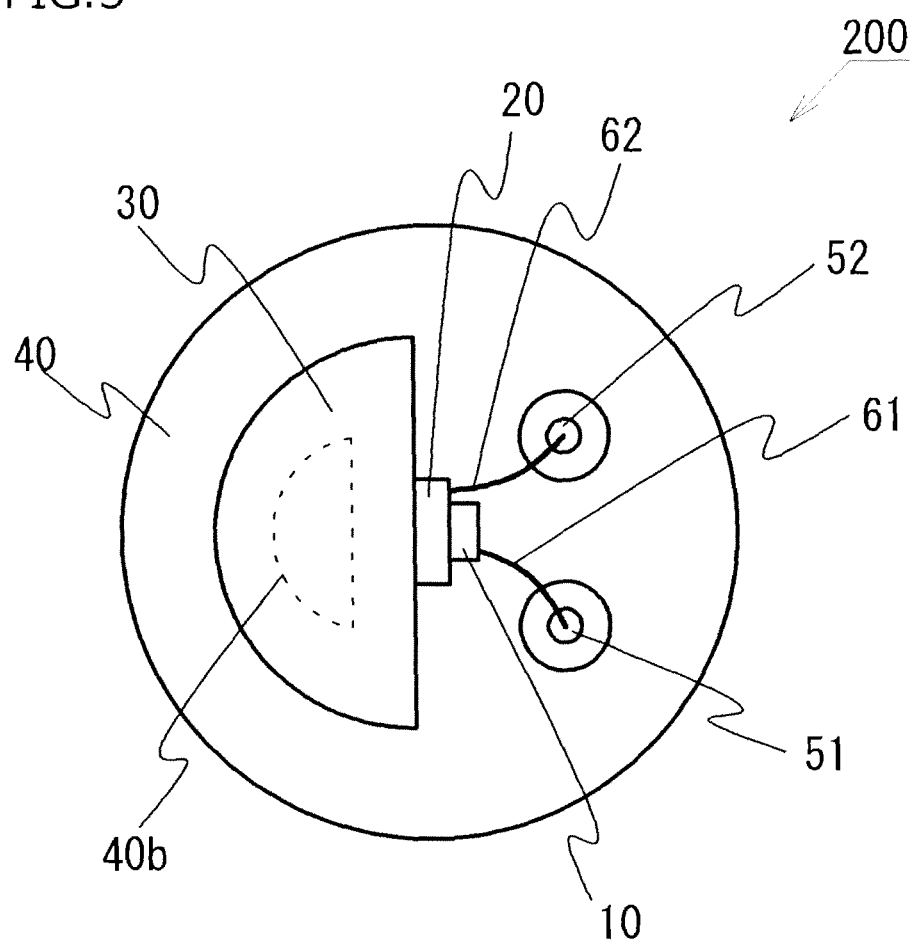
FIG. 5 is a schematic plan view of a semiconductor laser device according to Embodiment 2.

FIG. 5 is a schematic plan view of the semiconductor laser device according to Embodiment 2. As illustrated in FIG. 5, the semiconductor laser device 200 of Embodiment 2 basically has the same constitution as the semiconductor laser device 100 of Embodiment 1, but differs from the semiconductor laser device 100 of Embodiment 1 in that while the semiconductor laser device 100 has a cylindrical through hole 40b, the semiconductor laser device 200 has a through hole 40b whose shape is substantially along the periphery of the bottom of the recess 40a. As in the case of Embodiment 1, the semiconductor laser device 200 of Embodiment 2 not only can reduce a variation in heat dissipation, but also can increase the mounting accuracy on the mounting substrate. Moreover, the semiconductor laser device 200 according to Embodiment 2 allows for a void caused from the connecting member 400 to more uniformly escape. A periphery of the embedded member 70 preferably extends substantially along a periphery of the through hole 40b.

Light Source Device 500 According to Embodiment 1

FIG. 6 is a schematic cross-sectional view of the light source device according to Embodiment 1. As illustrated in FIG. 6, the light source device 500 of Embodiment 1 employs the semiconductor laser device 100 of Embodiment 1, and includes a mounting substrate 300, the semiconductor laser device 100 of Embodiment 1, and a connecting member 400 for connecting the lower surface of the base 40 to the mounting substrate 300. As discussed earlier, according to the semiconductor laser device 100 of Embodiment 1, the embedded member 70 disposed within the through hole 40b prevents air from staying in the through hole 40b as much as possible. Therefore, it is prevented as much as possible that gas such as air in the through hole 40b or a void caused from the conducting member 400 expands and moves inside the connecting member 400 located under the base 40 and misaligning in position or orientation at the mounting process occurs. Therefore, according to the light source device 500 of Embodiment 1, it is prevented as much as possible that the optical axis of the light emitted from the semiconductor laser element 10 or the light emitting point of the semiconductor laser element 10 shifts. Accordingly, a light source device having a stable beam property can be provided.

The mounting substrate 300 is preferably made of a material having good thermal conductivity such as a metal (copper, aluminum, or the like) or ceramics (aluminum oxide, aluminum nitride, silicon carbide, or the like). While the mounting substrate 300 may be constituted by engaging or fitting together a plurality of members, it is preferable that an integrally formed member is used as the mounting substrate 300. As shown in FIG. 6, the mounting substrate 300, in a cross-sectional view, has a plurality of stepped parts for accommodating semiconductor laser devices 100 and semiconductor laser devices 100 are individually mounted in each stepped part. In a case where a semiconductor laser device 100 is disposed within a stepped part, it is hard for the connecting member 400 to escape, and this allows for gas such air or a void caused from the connecting member 400 to easily enter into the through hole 40b. This embodiment, however, can prevent as much as possible that gas such as air or a void caused from the connecting member 400 from staying in the through hole 40b. Therefore, misaligning in position at the mounting process can be effectively reduced.

The connecting member 400 is preferably made of a material having a lower melting point than that of the joining member 80 to suppress that the joining member 80 is melted at the time when the semiconductor laser device 100 is mounted. With this arrangement, it is prevented as much as possible that the joining member 80 is melted at the time when the semiconductor laser device 100 is mounted on the mounting substrate 300. For example, in a case where silver solder is used as the joining member 80, a soldering material such as Sn—Ag—Cu-based, Sn—Zn—Bi-based, Sn—Cu-based, Sn—Ag—In—Ag-based, Sn—Pb-based, Au—Sn, Au—Si, Au—Ge or the like can be used as the connecting member 400.

The connecting member 400 can also connect the lower surface of the embedded member 70 to the base 40. With this arrangement, the number of the heat transfer paths to the mounting substrate 300 can be increased, thereby it becomes possible to enhance heat dissipation.

Light Source Device According to Embodiment 2

The light source device according to Embodiment 2 differs from the light source device 500 of Embodiment 1 in that it has a semiconductor laser device 200 of Embodiment 2. The explanation for features other than the above is omitted because other features the same as those of the light source device 500 of Embodiment 1.

Method of Producing the Semiconductor Laser Device 100 According to Embodiment 1

FIGS. 7A to 7C are schematic views explaining the method of producing the semiconductor laser device 100 of Embodiment 1. The method of producing the semiconductor laser device 100 of Embodiment 1 is explained below by referring to FIGS. 7A to 7C.

(Step 1)

First, as shown in FIG. 7A, a mounting body 30, a base 40 and an embedded member 70 are provided. The base 40 has a recess 40a and a through hole 40b. The mounting body 30 is to be mounted in the recess 40a. The through hole 40b penetrates a part of the bottom of the recess 40a. The embedded member 70 is to be disposed within the through hole 40b.

(Step 2)

Next, as shown in FIG. 7B, the mounting body 30 is mounted in the recess 40a of the base 40 while joining the lowermost surface of the mounting body 30 to the uppermost surface of the embedded member 70 so that the lowermost surface of the embedded member 70 is positioned higher than the lowermost surface of the base 40. In other words, the mounting body 30, base 40 and embedded member 70 are joined simultaneously. They are preferably joined using a joining member 80. The joining member 80 is preferably disposed so as to spread between the outer lateral surface of the embedded member 70 and the inner lateral surface of the through hole 40b, more preferably is disposed entirely around the embedded member 70 so as to fill the gap between the outer lateral surface of the embedded member 70 and the inner lateral surface of the through hole 40b.

(Step 3)

Next, as shown in FIG. 7C, the semiconductor laser element 10 is mounted on the mounting body 30.

The method of producing the semiconductor laser device 100 of Embodiment 1 explained above forms the mounting body 30, base 40 and the embedded member 70 simultaneously, and can reduce the number of process, and thus can increase the manufacturability. By simultaneously joining the mounting body 30, base 40 and the embedded member 70, it is possible to join each member at desired positions. For example, if the base 40 was joined first to the mounting body 30, the joining member 80 would flow over an inner lateral surface of the remaining part 41 and it would be impossible to enter the embedded member 70 into the through hole 40b. As another example, if the mounting body 30 was first joined to the embedded member 70, it would be difficult to align the members because the embedded member 70 must be joined to the mounting body 30 by taking the position of the through hole 40b into consideration. By forming the mounting body 30, base 40 and the embedded member 70 simultaneously, it becomes easier to join them together.

Figure 7D:
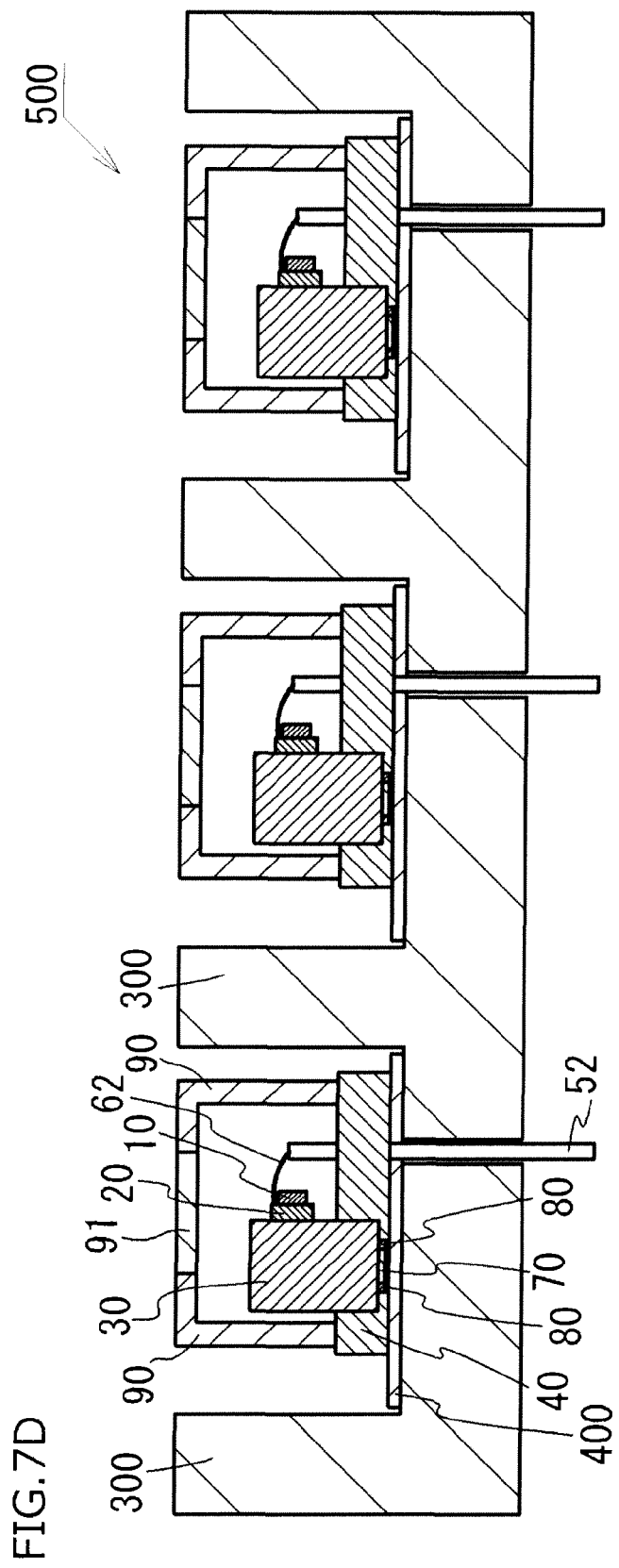
FIG. 7D is a schematic view explaining a method of producing the light source device according to Embodiment 1.

As shown in FIG. 7D, the light source device 500 employing the semiconductor laser devices 100 of Embodiment 1 is obtained by mounting the semiconductor laser devices 100 produced by the above-described process on the mounting substrate 300. The semiconductor laser devices are mounted, for example, so that the lower surface of the base 40 is connected to the upper surface of the mounting substrate 300 using a connecting member 400. In FIG. 7D, cap 90 is formed on the bases 40 in each semiconductor laser devices 100. Each cap 90 has an opening in which a light transmitting material 91 such as glass is disposed.

Method of Producing the Semiconductor Laser Device 200 According to Embodiment 2

As discussed in the foregoing, the semiconductor laser device 200 of Embodiment 2 is the same as the semiconductor laser device 100 of Embodiment 1 except that, in Embodiment 2, a periphery of the through hole 40b extends substantially along a periphery of the bottom of the recess 40a. Thus, the semiconductor laser device 200 of Embodiment 2 can be produced by the same processes as those for the semiconductor laser device 100 of Embodiment 1 except for, in Step 1, providing a base 40 having a through hole 40b with a periphery that extends substantially along a periphery of the bottom of the recess 40a. The light source device employing the semiconductor laser device 200 of Embodiment 2 can be produced by the same processes as those for the light source device 500 employing the semiconductor laser devices 100 of Embodiment 1.

Some embodiments have been explained in the forgoing. These explanations, however, relate to examples, and do not in any way limit the constitutions specified in the claims section.

What is claimed is:

1. A semiconductor laser device comprising:
    a semiconductor laser element;
    a mounting body on which the semiconductor laser element is mounted;
    a base having a recess in which the mounting body is mounted and a through hole that penetrates a part of a bottom of the recess; and
    an embedded member disposed within the through hole, wherein an uppermost surface of the embedded member is joined to a lowermost surface of the mounting body and a lowermost surface of the embedded member is positioned higher than a lowermost surface of the base.

2. The semiconductor laser device according to claim 1, wherein a joining member is disposed between an outer lateral surface of the embedded member and an inner lateral surface of the through hole.

3. The semiconductor laser device according to claim 2, wherein the joining member is disposed entirely around the embedded member so as to fill a gap between the outer lateral surface of the embedded member and the inner lateral surface of the through hole.

4. The semiconductor laser device according to claim 1, wherein a shape of a periphery of the embedded member is substantially the same as a shape of a periphery of the through hole.

5. The semiconductor laser device according to claim 4, wherein the embedded member and the through hole each have a cylindrical shape, and a diameter of the embedded member is smaller than a diameter of the through hole.

6. The semiconductor laser device according to claim 1, wherein the mounting body and the embedded member are each made of a metal material.

7. The semiconductor laser device according to claim 6, wherein the embedded member is made of as the same material as the mounting body.

8. The semiconductor laser device according to claim 1, wherein a shortest distance between the lowermost surface of the embedded member and the lowermost surface of the base is in a range of 1 μm to 50 μm.

9. The semiconductor laser device according to claim 1, wherein, in a plan view, an area of the through hole is in a range of 5% to 80% of an area of the bottom part of the recess.

10. The semiconductor laser device according to claim 3, wherein the gap between the outer lateral surface of the embedded member and the inner lateral surface of the through hole is in a range of 20 μm to 100 μm.

11. A light source device comprising:
    a mounting substrate,
    the semiconductor laser device according to claim 1, and
    a connecting member configured to connect the lowermost surface of the base to the mounting substrate.

12. The light source device according to claim 11, wherein the connecting member is made of a material having a lower melting point than that of the joining member.

13. The light source device according to claim 12, wherein the connecting member is made of a silver solder and the connecting member is made of a soldering material.

14. A light source device comprising:
a mounting substrate,
the semiconductor laser device according to claim 7, and
a connecting member for connecting the lowermost surface of the base to the mounting substrate.

15. A method of producing a semiconductor laser device, the method comprising:
providing a mounting body;
providing a base including a recess and a through hole that penetrates a part of a bottom of the recess;
providing an embedded member;
mounting the mounting body in the recess of the base, while joining a lowermost surface of the mounting body to an uppermost surface of the embedded member so that a lowermost surface of the embedded member is positioned higher than a lowermost surface of the base; and
mounting a semiconductor laser element on the mounting body.

16. The method of producing a semiconductor laser device according to claim 15, wherein the mounting body, the base and the embedded member are joined using a joining member.

17. The method of producing a semiconductor laser device according to claim 16, wherein the joining member is disposed so as to spread between an outer lateral surface of the embedded member and an inner lateral surface of the through hole.

18. The method of producing a semiconductor laser device according to claim 17, wherein the joining member is disposed entirely around the embedded member in the joining step so as to fill the gap between the outer lateral surface of the embedded member and the inner lateral surface of the through hole.

19. A method of producing a light source device comprising:
producing a semiconductor laser device by the method according to claim 15, and
mounting the semiconductor laser device on a mounting substrate using a connecting member such that the lowermost surface of the base is used as a mounting surface.

20. The method of producing a light source device according to claim 19, wherein the connecting member is made of a material having a lower melting point than that of the joining member.

* * * * *